US010396068B2

(12) United States Patent
Lee et al.

(10) Patent No.: US 10,396,068 B2
(45) Date of Patent: Aug. 27, 2019

(54) ELECTROSTATIC DISCHARGE PROTECTION DEVICE

(71) Applicant: ALi Corporation, Hsinchu (TW)

(72) Inventors: Chuan-Sheng Lee, Taipei (TW); Bing-You Gao, Taipei (TW)

(73) Assignee: ALi Corporation, Hsinchu (TW)

( * ) Notice: Subject to any disclaimer, the term of this patent is extended or adjusted under 35 U.S.C. 154(b) by 247 days.

(21) Appl. No.: 15/463,568

(22) Filed: Mar. 20, 2017

(65) Prior Publication Data

US 2017/0324238 A1   Nov. 9, 2017

(30) Foreign Application Priority Data

May 4, 2016   (CN) .......................... 2016 1 0289340

(51) Int. Cl.
*H01L 27/02*   (2006.01)
*H02H 9/04*    (2006.01)
*H01L 23/60*   (2006.01)

(52) U.S. Cl.
CPC ...... *H01L 27/0288* (2013.01); *H01L 27/0285* (2013.01); *H01L 23/60* (2013.01); *H02H 9/046* (2013.01)

(58) Field of Classification Search
CPC . H01L 23/647; H01L 27/092; H01L 27/0266; H01L 27/0288; H02H 9/046
USPC .......................................................... 361/56
See application file for complete search history.

(56) References Cited

U.S. PATENT DOCUMENTS

| 7,495,873 | B2 | 2/2009 | Bhattacharya et al. |
| 2005/0057866 | A1* | 3/2005 | Mergens ............. H01L 27/0262 361/56 |
| 2006/0209478 | A1* | 9/2006 | Arai .................... H01L 27/0262 361/56 |
| 2006/0262472 | A1* | 11/2006 | Okushima ........... H01L 27/0251 361/91.1 |
| 2009/0097174 | A1* | 4/2009 | Ker ..................... H01L 27/0266 361/56 |
| 2017/0069618 | A1* | 3/2017 | Altolaguirre ....... H01L 27/0262 |

OTHER PUBLICATIONS

Yi-Cheng Liu., "Mixed-Voltage-Tolerant I/O Cell With Dynamic Biasing and Sub 3×VDD Wide Range Mixed-Voltage-Tolerant I/O Cell", National Sun Yat-sen University, Department of Electrical Engineering, Thesis, Jun. 2009, pp. 1-76.

* cited by examiner

*Primary Examiner* — Kevin J Comber
(74) *Attorney, Agent, or Firm* — J.C. Patents

(57) ABSTRACT

An electrostatic discharge (ESD) protection device including an ESD protection unit and a control circuit is provided. When a voltage level of a signal received by a signal input terminal reaches an ESD protection level, the ESD protection unit transmits the signal from the signal input terminal to the system voltage terminal. The control circuit controls a conduction state between the signal input terminal and the system voltage terminal through the ESD protection unit. The control circuit generates a control voltage according to the voltage level of the signal received by the signal input terminal and a system voltage level of the system voltage terminal to control the ESD protection unit, and to prevent the ESD protection unit from transmitting the signal to the system voltage terminal when the voltage level of the signal received by the signal input terminal does not reach the ESD protection level.

13 Claims, 3 Drawing Sheets

ELECTROSTATIC DISCHARGE PROTECTION DEVICE

CROSS-REFERENCE TO RELATED APPLICATION

This application claims the priority benefit of China application serial no. 201610289340.X, filed on May 4, 2016. The entirety of the above-mentioned patent application is hereby incorporated by reference herein and made a part of this specification.

BACKGROUND OF THE INVENTION

Field of the Invention

The present invention relates to a circuit protection device, and more particularly, to an electrostatic discharge (ESD) protection device capable of preventing current leakage.

Description of Related Art

Electronic components (for example, integrated circuits) are subject to impact of electrostatic discharge (ESD) in actual application environments. Since a voltage of the ESD is considerably higher than a system voltage provided under normal conditions, when the ESD is occurred, an ESD current probably damages the electronic components. Therefore, some ESD protection measures have to be arranged to the electronic components to release the ESD current to avoid damaging the electronic components.

A commonly used method at the present is to design an ESD protection device between a core circuit and a signal pad, so as to protect the internal circuit. Conventionally, devices such as diodes, gate-grounded N-type metal-oxide-semiconductor (GGNMOS) transistors, or gate-connected to power (VDD) PMOS transistors are serially connected to implement the circuit of the ESD protection device. However, once a signal is transmitted between two devices of which working voltages are different, the ESD protection device may mistakenly operate to cause current leakage when the ESD phenomenon is not actually occurred. In this way, reliability of the ESD protection device is decreased.

SUMMARY OF THE INVENTION

The present invention is directed to an electrostatic discharge (ESD) protection device, which prevents current leakage resulting from mis-conducting a current path between a signal input terminal and a system voltage terminal under a normal signal voltage level, so as to achieve good ESD protection capability.

The present invention provides an electrostatic discharge (ESD) protection device including an ESD protection unit and a control circuit. The ESD protection unit is coupled between a signal input terminal and a system voltage terminal. When a voltage level of a signal received by the signal input terminal reaches an ESD protection level, the ESD protection unit transmits the signal from the signal input terminal to the system voltage terminal. The control circuit is coupled to a control terminal of the ESD protection unit, and controls a conduction state between the signal input terminal and the system voltage terminal through the ESD protection unit. The control circuit generates a control voltage according to the voltage level of the signal received by the signal input terminal and a system voltage level of the system voltage terminal to control the ESD protection unit to be tightly closed, so as to prevent current leakage, and make the ESD protection unit not transmit the signal to the system voltage terminal when the voltage level of the signal received by the signal input terminal does not reach the ESD protection level.

According to the above description, in the embodiment of the present invention, the control circuit is configured at the control terminal of the ESD protection unit, the ESD protection unit is controlled to be tightly closed according to the voltage level of the signal received by the signal input terminal and the system voltage level of the system voltage terminal. In this way, good ESD protection capability is achieved and reliability is improved in a small area circuit layout.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
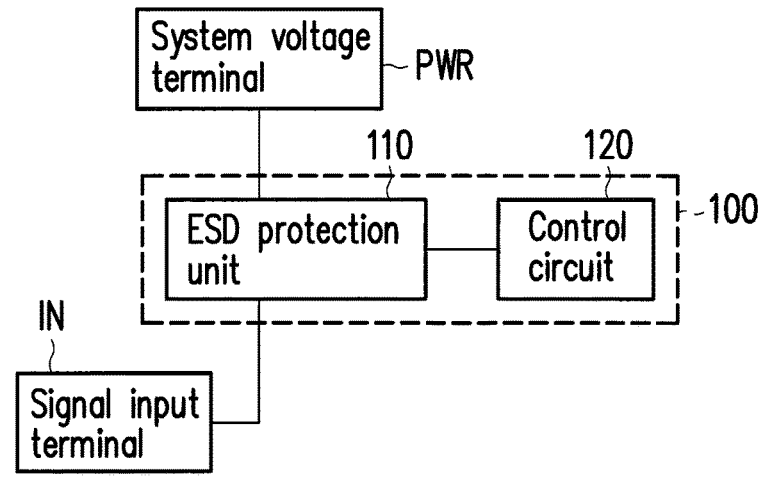
FIG. 1 is a block diagram of an electrostatic discharge (ESD) protection device according to an embodiment of the present invention.

FIG. 1 is a block diagram of an electrostatic discharge (ESD) protection device according to an embodiment of the present invention. In an embodiment of the present invention, a system voltage terminal PWR provides power required for operating a first electronic component (for example, the first electronic component is operated between 0V and 1.8V). A signal input terminal IN receives a signal voltage level of a different voltage domain (for example, 0V to 3.3V). In this case, since the voltage domain of the signal is different from the voltage domain of the first electronic component, the embodiment of the present invention provides an ESD protection device 100 between the system voltage terminal PWR and the signal input terminal IN. Not only the first electronic component could be protected against ESD occurred at the signal input terminal IN, but a current leakage that probably would occur when the signal input terminal IN receives a signal with a higher voltage level may also be avoided. However, the present invention is not limited to the voltage ranges of the aforementioned voltage domains. On the other hand, the signal source received by the signal input terminal is also not limited by the present invention. In other words, in other embodiments, the signal received by the signal input terminal IN can be from human body ESD (HBM), mechanical ESD (MM) or other signal sources probably generating high charges.

Referring to FIG. 1, the ESD protection device 100 of the present embodiment includes an ESD protection unit 110 and a control circuit 120. The ESD protection device 100 is coupled between the signal input terminal IN and the system voltage terminal PWR. The control circuit 120 is coupled to a control terminal of the ESD protection unit 110, and is configured to prevent current leakage between the signal input terminal IN and the system voltage terminal PWR when the voltage level of the signal is changed.

To be specific, in the present embodiment, when the ESD phenomenon is occurred, and the voltage level of the signal received by the signal input terminal IN reaches (or is higher than) a predetermined ESD protection level, the ESD protection unit 110 turns on a current path between the signal input terminal IN and the system voltage terminal PWR, such that the signal is transmitted from the signal input terminal IN to a power rail of the system voltage terminal PWR, and is finally transmitted to the ground to release the ESD current. On the other hand, when the voltage level of the signal received by the signal input terminal IN does not reach the ESD protection level, the control circuit 120 may generate a control signal to turn off the current path between the signal input terminal IN and the system voltage terminal PWR, such that the signal cannot be transmitted to the system voltage terminal PWR from the signal input terminal IN.

It should be noted that the "ESD protection level" mentioned in the embodiment of the present invention refers to a predetermined potential value used for determining whether the ESD protection unit 110 should turn on the current path between the signal input terminal IN and the system voltage terminal PWR. Those skilled in the art may set the predetermined potential value according to a physical status of the ESD protection unit 110. For example, when the ESD protection unit 110 is a transistor, the ESD protection level can be a potential value causing a snapback breakdown of the transistor. In other words, the ESD protection level is a potential value relative to the system voltage terminal PWR and a characteristic of the ESD protection unit 110 itself, instead of an absolute potential threshold. Those skilled in the art would find sufficient teaching from the circuits disclosed in each of the embodiments for determining the actual ESD protection level.

In the present embodiment, the ESD protection unit 110 can be implemented by a P-type metal-oxide-semiconductor (PMOS) or N-type metal-oxide-semiconductor (NMOS) transistor, though the present invention is not limited thereto. Moreover, the ESD protection unit 110 at least has a control terminal (for example, a gate) connected to the control circuit 120 for receiving the control signal from the control circuit 120.

In the present embodiment, the control circuit 120 generates the control signal according to the voltage level of the signal received by the signal input terminal IN and the system voltage level of the system voltage terminal PWR, and outputs the control signal to the ESD protection unit 110, such that when the ESD phenomenon is not occurred, the ESD protection unit 110 may prevent the current leakage between the signal input terminal IN and the system voltage terminal PWR.

Figure 2:
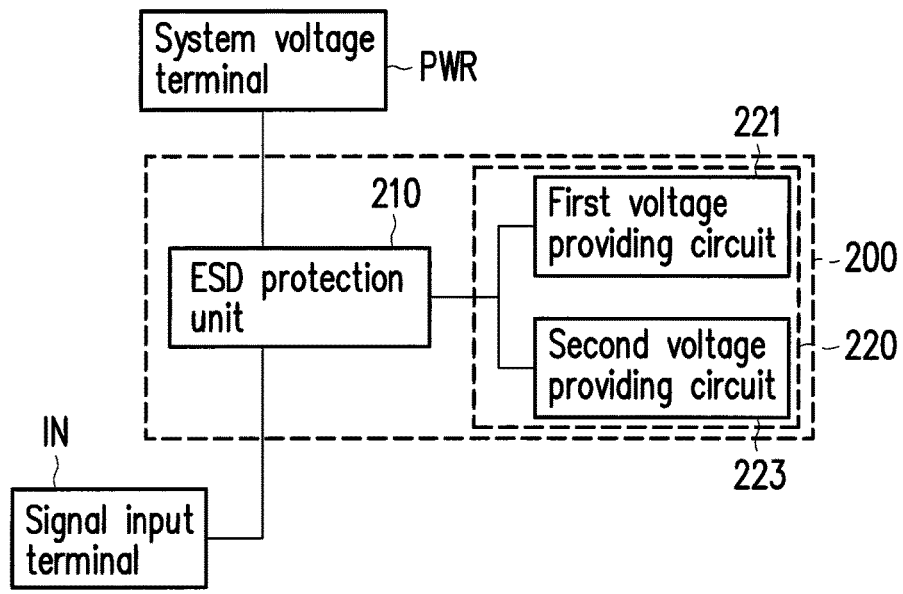
FIG. 2 is a block diagram of an ESD protection device according to an embodiment of the present invention.

FIG. 2 is a block diagram of an ESD protection device according to an embodiment of the present invention. A structure of the ESD protection device 200 of the present embodiment is similar to that of the ESD protection device 100 of FIG. 1, and descriptions of the similar components therein are not repeated. Referring to FIG. 2, in an embodiment, the control circuit 220 includes a first voltage providing circuit 221 and a second voltage providing circuit 223. As described in the previous paragraph, when the ESD phenomenon is not occurred, or when the voltage level of the signal received by the signal input terminal IN does not reach the ESD protection level, the control circuit 220 may generate the control signal according to the voltage level of the signal received by the signal input terminal IN and the system voltage level of the system voltage terminal PWR, and the ESD protection unit 210 accordingly controls a conduction state between the signal input terminal IN and the system voltage terminal PWR.

For example, it is assumed that the system voltage level of the system voltage terminal PWR is 1.8V, and the signal input terminal IN receives a signal with a voltage level between 0V and 3.3V. In the present embodiment, when the voltage level (for example, 3.3V) of the signal received by the signal input terminal IN is higher than the system voltage level, the first voltage providing circuit 221 provides a control voltage according to the voltage level of the signal received by the signal input terminal IN, such that the signal at the signal input terminal IN is not transmitted to the system voltage terminal PWR. On the other hand, when the voltage level (for example, 0V) of the signal received by the signal input terminal IN is lower than the system voltage level, the second voltage providing circuit 223 provides a control voltage according to the system voltage level, such that the signal at the signal input terminal IN is not transmitted to the system voltage terminal PWR.

In order to achieve the aforementioned effects, the first voltage providing circuit 221 and the second voltage providing circuit 223 can be implemented by a plurality of circuit layouts. Following embodiments are provided to describe implementations of the first voltage providing circuit 221 and the second voltage providing circuit 223. However, the present invention is not limited to the implementations provided by the following embodiments, and those skilled in the art may appropriately modify the circuit layout provided by each of the embodiments to achieve similar functions or adding additional functions to satisfy actual usage demands.

Figure 3:
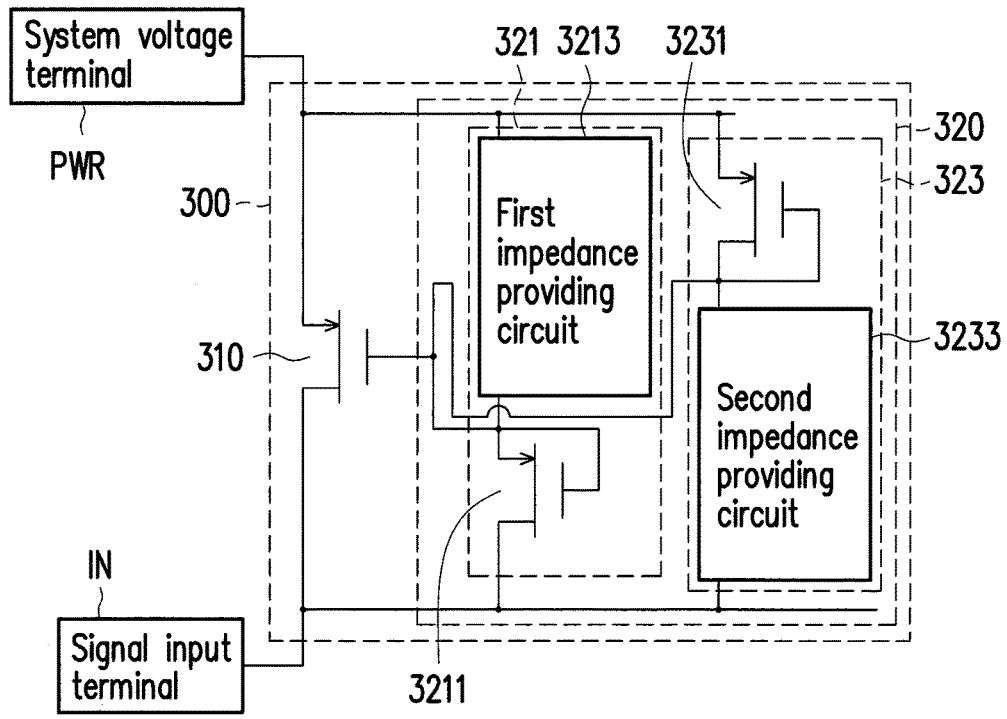
FIG. 3 is a schematic diagram of a circuit structure of an ESD protection device according to an embodiment of the present invention.
Figure 4:
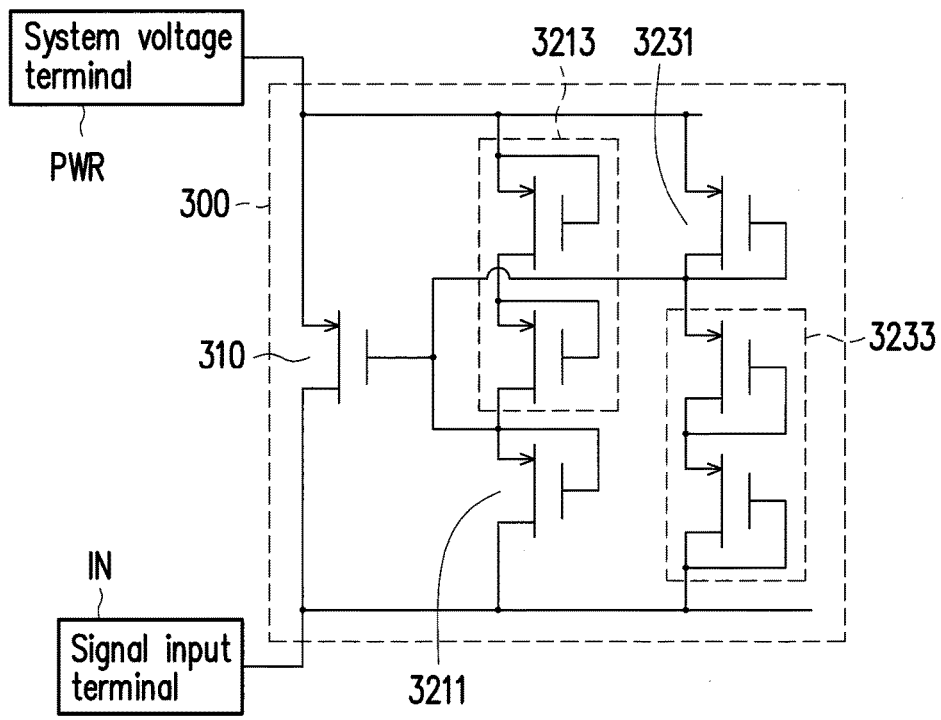
FIG. 4 is a circuit diagram of an ESD protection device according to an embodiment of the present invention.

FIG. 3 is a schematic diagram of a circuit structure of an ESD protection device according to an embodiment of the present invention. FIG. 4 is a circuit diagram of an ESD protection device according to an embodiment of the present invention. The structure of the ESD protection device 300 of the present embodiment is similar to the ESD protection device 200 of FIG. 2, so that descriptions of the similar components are not repeated. Particularly, the first voltage providing circuit 221 and the second voltage providing circuit 223 of the embodiment of FIG. 2 can be respectively implemented by a first voltage providing circuit 321 and a second voltage providing circuit 323 of the embodiment of FIG. 3.

Referring to FIG. 3 and FIG. 4, in the present embodiment, the ESD protection unit 310 is a PMOS transistor, and a threshold voltage thereof is, for example, 0.5V, though the present invention is not limited thereto. The control circuit 320 includes the first voltage providing circuit 321 and the second voltage providing circuit 323, where the first voltage providing circuit 321 and the second voltage providing circuit 323 are both coupled between the signal input terminal IN and the system voltage terminal PWR.

In detail, the first voltage providing circuit 321 includes a first transistor 3211 and a first impedance providing circuit 3213, and the second voltage providing circuit 323 includes a second transistor 3231 and a second impedance providing circuit 3233. In the present embodiment, a second terminal of the first transistor 3211 is coupled to the signal input terminal IN. A first terminal of the first impedance providing circuit 3213 is coupled to the system voltage terminal PWR, and a second terminal of the first impedance providing circuit 3213 is coupled to a first terminal of the first transistor 3211 and a control terminal of the ESD protection unit 310. On the other hand, a first terminal of the second impedance providing circuit 3233 is coupled to a control terminal of the second transistor 3231 and the control terminal of the ESD protection unit 310, and a second terminal of the second, impedance providing circuit 3233 is coupled to the signal input terminal IN. A first terminal of the second transistor 3231 is coupled to the system voltage terminal PWR, and a second terminal of the second transistor 3231 is coupled to the first terminal of the second impedance providing circuit 3233.

In the present embodiment, the first transistor 3211 and the second transistor 3231 are, for example, implemented by PMOS transistors, and low threshold voltage of the transistor 3211 and the second transistor 3231 are slightly lower than a threshold voltage of a transistor of the ESD protection unit 310. For example, the low threshold voltage can be 0.1 to 0.3V. However, the present invention is not limited thereto, and in other embodiments, the first transistor 3211 and the second transistor 3231 can be implemented by NMOS transistors according to an actual circuit demand.

In the present embodiment, as shown in FIG. 4, the first impedance providing circuit 3213 includes at least one transistor (for example, two transistors) connected in series, and is configured to adjust the control voltage output by the first voltage providing circuit 321. Similarly, the second impedance providing circuit 3233 includes at least one transistor (for example, two transistors) connected in series, and is configured to adjust the control voltage output by the second voltage providing circuit 323.

In an embodiment, it is assumed that the system voltage level of the system voltage terminal PWR is 1.8V, and the voltage level of the signal received by the signal input terminal IN is between 0V and 3.3V. By using the circuit of the embodiment to implement the control circuit 320, when the voltage level of the signal received by the signal input terminal IN is a high voltage level (for example, 3.3V) higher than the system voltage level, since the low threshold voltages of the first transistor 3211 and the second transistor 3231 are both about 0.2V, the control terminal of the of the first transistor 3211 may provide a control voltage (for example, about 3.1V) to the control terminal of the ESD protection unit 310, and meanwhile the second transistor 3231 is in a turn-off state. In this way, the ESD protection unit 310 is in the turn-off state, and a leakage current is not transmitted from the signal input terminal IN to the system voltage terminal PWR. On the other hand, when the voltage level of the signal received by the signal input terminal IN is a low voltage level (for example, 0V) lower than the system voltage level, the first transistor 3211 is in the turn-off state, and the second transistor 3231 may provide a control voltage (for example, about 1.6V) to the ESD protection unit 310. In this way, the ESD protection unit 310 is in the turn-off state, and the system voltage terminal PWR is not transmitted to the signal received by the signal input terminal IN.

It should be noted that each of the first impedance providing circuit 3213 and the second impedance providing circuit 3233 of the present embodiment can include two PMOS transistors connected in series, so as to respectively adjust the control voltages provided by the first transistor 3211 and the second transistor 3231. However, implementation of the impedance providing circuits is not limited by the present invention. In other embodiments, each of the first impedance providing circuit 3213 and the second impedance providing circuit 3233 can also include NMOS transistors or resistors connected in series, and an equivalent impedance of the serial connection is used to adjust the control voltages provided by the first transistor 3211 and the second transistor 3231.

Figure 5:
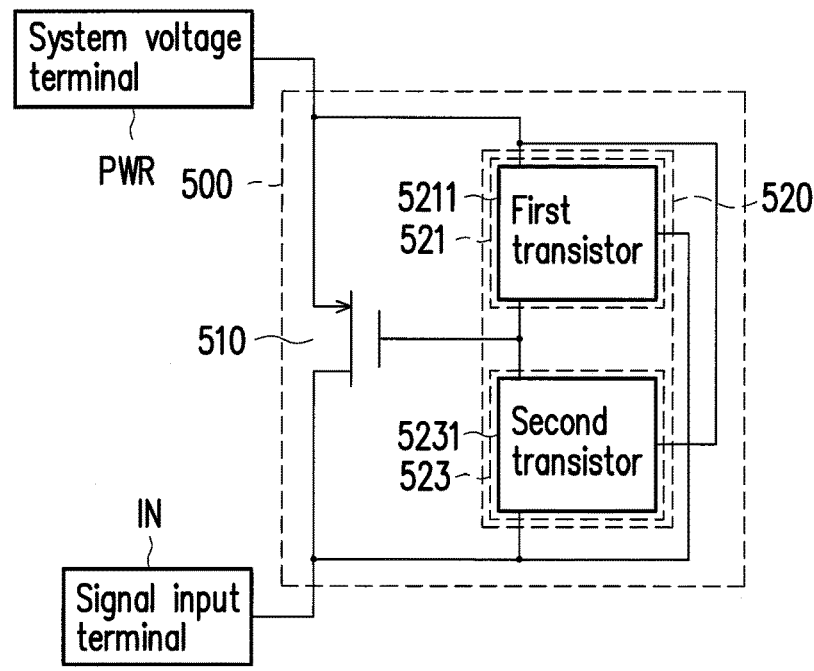
FIG. 5 is a schematic diagram of a circuit structure of an ESD protection device according to an embodiment of the present invention.
Figure 6:
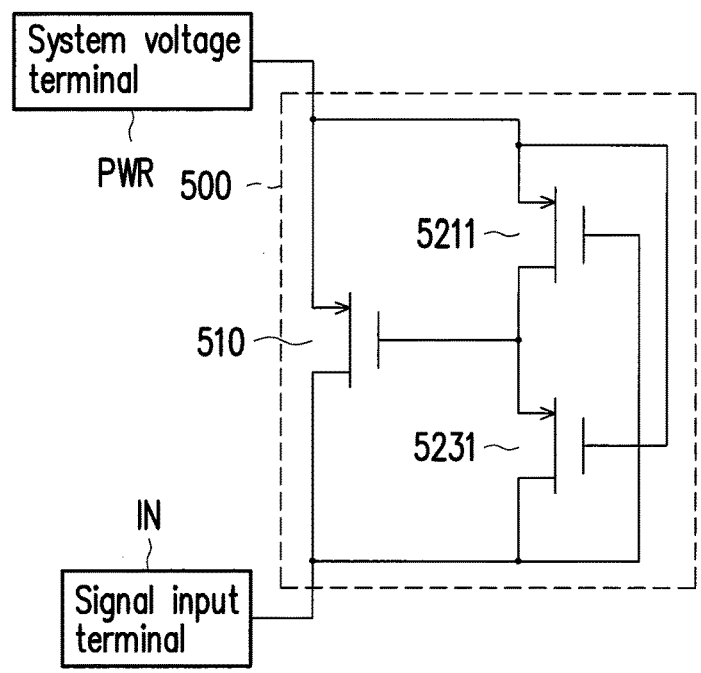
FIG. 6 is a circuit diagram of an ESD protection device according to an embodiment of the present invention.

FIG. 5 is a schematic diagram of a circuit structure of an ESD protection device according to an embodiment of the present invention. FIG. 6 is a circuit diagram of an ESD protection device according to an embodiment of the present invention. The structure of the ESD protection device 500 of the present embodiment is similar to the ESD protection device 200 of FIG. 2, so that descriptions of the similar components are not repeated. Particularly, the first voltage providing circuit 221 and the second voltage providing circuit 223 of the embodiment of FIG. 2 can be respectively implemented by a first voltage providing circuit 521 and a second voltage providing circuit 523 of the embodiment of FIG. 5.

Referring to FIG. 5 and FIG. 6, in an embodiment, the ESD protection unit 510 can be a PMOS transistor, and a threshold voltage thereof is, for example, 0.5V, though the present invention is not limited thereto. The control circuit 520 includes the first voltage providing circuit 521 and the second voltage providing circuit 523, where the first voltage providing circuit 321 and the second voltage providing circuit 323 are both coupled between the signal input terminal IN and the system voltage terminal PWR.

In the present embodiment, the first voltage providing circuit 521 is a first transistor 5211, and the second voltage providing circuit 523 is a second transistor 5231. As shown in FIG. 6, a first terminal of the first transistor 5211 is coupled to the system voltage terminal PWR. A control terminal of the second transistor 5231 is coupled to the system voltage terminal PWR. A second terminal of the first transistor 5211 and a first terminal of the second transistor 5231 are coupled to the control terminal of the ESD protection unit 510, and a second terminal of the second transistor 5231 is coupled to the signal input terminal IN and a control terminal of the first transistor 5211.

In an embodiment, as shown in FIG. 6, the first transistor 5211 can be a PMOS transistor, and the second transistor 5231 can be an NMOS transistor. However, the present invention is not limited thereto, and in another embodiment, when the ESD protection unit 510 is an NMOS transistor, the first transistor 5211 can be an NMOS transistor, and the second transistor 5231 can be a PMOS transistor.

In the present embodiment, it is assumed that the system voltage level of the system voltage terminal PWR is 1.8V, and the voltage level of the signal received by the signal input terminal IN is between 0V and 3.3V. By using the circuit of the embodiment to implement the control circuit 520, when the voltage level of the signal received by the signal input terminal IN is a high voltage level (for example, 3.3V) higher than the system voltage level, the first transistor 5211 is in the turn-off state, and the second transistor 5231 is in the turn-on state. Therefore, the second transistor 5231 provides the control voltage (for example, about 3.3V) to the control terminal of the ESD protection unit 510. In this way, the ESD protection unit 510 is in the turn-off state, such that the leakage current is not transmitted from the signal input terminal IN to the system voltage terminal PWR. On the other hand, when the voltage level of the signal received by the signal input terminal IN is a low voltage level (for example, 0V) lower than the system voltage level, the first transistor 5211 is in the turn-on state, and the second transistor 5231 is turned off. Therefore, the first transistor 5231 provides the control voltage (for example, about 1.8V) to the control terminal of the ESD protection unit 510. In this way, the ESD protection unit 510 is in the turn-off state, such that the system voltage terminal PWR is not transmitted to the signal received by the signal input terminal IN.

In summary, in the embodiments of the present invention, by providing the control circuit coupled to the control terminal of the ESD protection unit, and controlling the ESD protection unit according to the voltage level of the signal received by the signal input terminal and the system voltage level of the system voltage terminal, a transmission path of the signal received by the signal input terminal is controlled. In this way, when the ESD phenomenon is occurred, the signal with an excessive voltage level is transmitted to the system voltage terminal to avoid an excessive current damaging the circuit. On the other hand, when the ESD phenomenon is not occurred, under control of the control circuit, the signal received by the signal input terminal cannot be transmitted to the system voltage terminal regardless of whether the signal has a high voltage level or a low voltage level, so as to avoid a leakage current occurred during the signal transmission. In this way, the ESD protection device of the present invention may have good ESD protection capability and high reliability in a small area circuit layout.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electrostatic discharge protection device, comprising:
   an electrostatic discharge protection unit, coupled between a signal input terminal and a system voltage terminal, wherein when a voltage level of a signal received by the signal input terminal reaches an electrostatic discharge protection level, the electrostatic discharge protection unit transmits the signal from the signal input terminal to the system voltage terminal; and
   a control circuit, coupled to a control terminal of the electrostatic discharge protection unit, and controlling a conduction state between the signal input terminal and the system voltage terminal through the electrostatic discharge protection unit, wherein the control circuit comprises:
   a first voltage providing circuit comprising a first transistor and a first impedance providing circuit, wherein a first terminal, a second terminal and a control terminal of the first transistor are respectively coupled to the first impedance providing circuit, the signal input terminal and the control terminal of the electrostatic discharge protection unit, wherein a first terminal of the first impedance providing circuit is coupled to the system voltage terminal and a second terminal of the first impedance providing circuit is coupled to the first terminal of the first transistor and the control terminal of the electrostatic discharge protection unit; and
   a second voltage providing circuit comprising a second transistor and a second impedance providing circuit, wherein a first terminal, a second terminal and a control terminal of the second transistor are respectively coupled to the system voltage terminal, a first terminal of the second impedance providing circuit and the control terminal of the electrostatic discharge protection unit, wherein the first terminal of the second impedance providing circuit is further coupled to the control terminal of the electrostatic discharge protection unit and a second terminal of the second impedance providing circuit is coupled to the signal input terminal,
   wherein the control circuit generates a control voltage according to the voltage level of the signal received by the signal input terminal and a system voltage level of the system voltage terminal to control the electrostatic discharge protection unit, and to make the electrostatic discharge protection unit not transmit the signal to the system voltage terminal when the voltage level of the signal received by the signal input terminal does not reach the electrostatic discharge protection level.

2. The electrostatic discharge protection device as claimed in claim 1, wherein a voltage domain of the signal input terminal is different from a voltage domain of the system voltage terminal.

3. The electrostatic discharge protection device as claimed in claim 1, wherein the electrostatic discharge protection unit is one of a P-type metal-oxide-semiconductor transistor and an N-type metal-oxide-semiconductor transistor.

4. The electrostatic discharge protection device as claimed in claim 1, wherein the control circuit is configured to determine one of the first voltage providing circuit and the second voltage providing circuit to output the control voltage according to the voltage level of the signal received by the signal input terminal.

5. The electrostatic discharge protection device as claimed in claim 4, wherein the first voltage providing circuit and the second voltage providing circuit are coupled between the signal input terminal and the system voltage terminal,
   wherein when the voltage level of the signal received by the signal input terminal is higher than the system voltage level, the first voltage providing circuit outputs the control voltage according to the voltage level of the signal, and
   when the voltage level of the signal received by the signal input terminal is lower than the system voltage level, the second voltage providing circuit outputs the control voltage according to the system voltage level of the system voltage terminal.

6. The electrostatic discharge protection device as claimed in claim 4, wherein the electrostatic discharge protection unit is a transistor, and wherein low threshold voltages of the first transistor and the second transistor are lower than the threshold voltage of the electrostatic discharge protection unit.

7. The electrostatic discharge protection device as claimed in claim 4, wherein each of the first impedance providing circuit and the second impedance providing circuit comprises at least one transistor or at least one resistor connected in series.

8. An electrostatic discharge protection device, comprising:
   an electrostatic discharge protection unit, coupled between a signal input terminal and a system voltage terminal, wherein when a voltage level of a signal received by the signal input terminal reaches an electrostatic discharge protection level, the electrostatic discharge protection unit transmits the signal from the signal input terminal to the system voltage terminal; and a control circuit, coupled to a control terminal of the electrostatic discharge protection unit, and controlling a conduction state between the signal input terminal and the system voltage terminal through the electrostatic discharge protection unit, wherein the control circuit comprises:

a first voltage providing circuit as a first transistor, wherein a first terminal of the first transistor is coupled to the system voltage terminal; and a second voltage providing circuit as a second transistor, wherein a control terminal of the second transistor is coupled to the system voltage terminal, a second terminal of the first transistor and a first terminal of the second transistor are coupled to the control terminal of the electrostatic discharge protection unit, and a second terminal of the second transistor is coupled to the signal input terminal and a control terminal of the first transistor, wherein the control circuit generates a control voltage according to the voltage level of the signal received by the signal input terminal and a system voltage level of the system voltage terminal to control the electrostatic discharge protection unit, and to make the electrostatic discharge protection unit not transmit the signal to the system voltage terminal when the voltage level of the signal received by the signal input terminal does not reach the electrostatic discharge protection level.

9. The electrostatic discharge protection device as claimed in claim 8, wherein a voltage domain of the signal input terminal is different from a voltage domain of the system voltage terminal.

10. The electrostatic discharge protection device as claimed in claim 8, wherein the electrostatic discharge protection unit is one of a P-type metal-oxide-semiconductor transistor and an N-type metal-oxide-semiconductor transistor.

11. The electrostatic discharge protection device as claimed in claim 8, wherein the control circuit is configured to determine one of the first voltage providing circuit and the second voltage providing circuit to output the control voltage according to the voltage level of the signal received by the signal input terminal.

12. The electrostatic discharge protection device as claimed in claim 11, wherein the first voltage providing circuit and the second voltage providing circuit are coupled between the signal input terminal and the system voltage terminal, wherein when the voltage level of the signal received by the signal input terminal is higher than the system voltage level, the first voltage providing circuit outputs the control voltage according to the voltage level of the signal, and when the voltage level of the signal received by the signal input terminal is lower than the system voltage level, the second voltage providing circuit outputs the control voltage according to the system voltage level of the system voltage terminal.

13. The electrostatic discharge protection device as claimed in claim 8, wherein the first transistor is one of an N-type metal-oxide-semiconductor transistor and a P-type metal-oxide-semiconductor transistor, and the second transistor is the other one of the N-type metal-oxide-semiconductor transistor and the P-type metal-oxide-semiconductor transistor.

* * * * *